United States Patent [19]

Rogers et al.

[11] Patent Number: 5,236,512
[45] Date of Patent: Aug. 17, 1993

[54] METHOD AND APPARATUS FOR CLEANING SURFACES WITH PLASMA

[75] Inventors: Ernest E. Rogers, Pleasant Grove; Blaine A. Frandsen, Garland; C. Lamont Hislop, Clearfield, all of Utah

[73] Assignee: Thiokol Corporation, Ogden, Utah

[21] Appl. No.: 745,457

[22] Filed: Aug. 14, 1991

[51] Int. Cl.⁵ .................... B08B 6/00; A47L 13/40
[52] U.S. Cl. .......................... 134/1; 134/21; 156/345
[58] Field of Search ............... 134/1, 21; 15/1.5 R, 15/320; 156/345

[56] References Cited

U.S. PATENT DOCUMENTS

| | | | |
|---|---|---|---|
| 2,127,229 | 8/1938 | McRae | 204/32 |
| 2,752,271 | 6/1956 | Walkup et al. | 134/1 |
| 2,832,977 | 5/1958 | Walkup et al. | 15/1.5 |
| 2,985,756 | 5/1961 | Holland | 250/49.5 |
| 3,668,008 | 6/1972 | Severnyse | 134/1 |
| 3,743,540 | 7/1973 | Hudson | 134/1 |
| 4,500,564 | 2/1985 | Enomoto | 427/39 |
| 4,576,698 | 3/1986 | Gallagher et al. | 134/1 |
| 4,657,616 | 4/1987 | Benzing et al. | 134/1 |
| 4,751,759 | 6/1988 | Zoell | 15/1.5 |
| 4,863,561 | 9/1989 | Freeman et al. | 134/1 |
| 5,127,988 | 7/1992 | Kawamura et al. | 156/345 |

Primary Examiner—Theodore Morris
Assistant Examiner—Saeed T. Chaudhry
Attorney, Agent, or Firm—Madson & Metcalf

[57] ABSTRACT

A device is provided for cleaning a surface by introducing a highly reactive gas mixture to the surface. The highly reactive gas mixture may include excited species such as ozone and relate excited ions, atoms, and electrons. The excited gas mixture then oxidizes undesirable materials on the surface. The device includes a structure which defines an enclosed space when placed against the surface to be cleaned. A set of one or more electrodes are positioned within the device such that an electrical discharge across the electrodes excites the selected gases species. The electrodes are attached to a power supply capable of generating a high frequency, high voltage discharge. A tube is provided for transporting selected gases, such as air or oxygen, to the enclosed space. Another tube is provide for removing reaction products from the enclosed space. This tube is place in communication with a source of suction for establishing a flow of gases into and out of the enclosed space.

17 Claims, 2 Drawing Sheets

METHOD AND APPARATUS FOR CLEANING SURFACES WITH PLASMA

BACKGROUND

1. The Field of the Invention

The present invention is related to an apparatus, and methods for its use, which is capable of cleaning a surface by using ozone, plasma, or other excited gas. More particularly, the present invention is related to an apparatus which is capable of producing a mixture of excited gases and using that excited gas mixture to oxidize or otherwise react with contaminants on a surface, such that those contaminants can be removed from the surface, or their deleterious effect eliminated.

2. Technical Background

One challenge in many different industries has been cleaning surfaces sufficiently that troublesome contaminants are removed or their effects eliminated from the surface. In many different contexts it is necessary to provide a microscopically clean surface. This is particularly true in certain types of manufacturing and processing industries. For example, in coating processes it is often necessary to clean the surface to be coated before the coating procedure takes place. If the surface is not sufficiently clean, the coating process may be ineffective or inefficient due to surface contamination.

Use of modern adhesives may also require a very clean surface. In order to effectuate a secure bond, it is necessary to remove or modify essentially all surface contamination. It may also be necessary to activate the surface in a specific manner. Failure to do so may lead to ineffective bonding, or failure of the bond at some point in the future.

Similar cleaning is required in many other contexts. It will be appreciated, however, that the inability to effectively clean a surface can hamper manufacturing and processing procedures. Use of a contaminated surface can result in failure of parts and machinery, and ineffective coatings and bonding, as well as other problems.

Many different types of surface contaminants must be removed during processing and manufacture. Organic compounds such as greases and oils are particularly troublesome. While water soluble contaminants may be easily removed, organic greases and oils are more difficult to effectively remove. These substances tend to be more persistent in coating a surface, making thorough surface cleaning difficult, time consuming, and expensive.

In order to provide a clean surface it is conventional to use various types of cleaners. Since many troublesome contaminants are organic compounds, such cleaners often take the form of organic liquid solvents and cleaners. These solvents are employed in order to dissolve and remove oily contamination from the subject surface. It will be appreciated that other types of cleaning compounds are also known for removing other types of contaminants. However, conventional cleaning methods, whether employing detergents, solvents, or mechanical scrubbing, all suffer certain drawbacks.

Many solvents and cleaners are known to be extremely dangerous. Such solvents and cleaners are often flammable, toxic and/or corrosive. Thus, special care must be taken when using such materials, and special handling is often required in order to dispose of the spent material. In addition, many such materials are known to be environmentally harmful. Obviously, hazardous materials must be disposed of in accordance with applicable hazardous waste disposal regulations. Furthermore, some solvents, such as methyl chloroform, are suspected of causing environmental damage in the form of ozone layer depletion. As concern for the ozone layer increases, opposition to the use of chemicals such as methyl chloroform also increases.

Accordingly, use of effective solvents and cleaners is expected to become more difficult and expensive in the future. It is expected that additional environmental safety regulations will be imposed on the use of this type of material. In any event, existing environmental and safety regulation alone significantly adds to the expense and general inconvenience of using this type of material.

It would, therefore, be a significant advancement in the art to provide methods for cleaning a surface which avoid many of the problems encountered in the existing art. In particular, it would be an advancement in the art to provide improved methods and apparatus for removing contaminants from a surface or eliminating their effects, including organic contaminants. It would be a related advancement in the art to provide methods and apparatus for removing contaminants from a surface which did not rely on the use of organic solvents. More particularly, it would be an advancement in the art to provide methods and apparatus for removing contaminants from a surface which did not rely on the use of liquid materials which are corrosive, toxic, flammable, and/or environmentally damaging and which present difficulties in disposal.

It would be an additional advancement in the art to provide methods and apparatus for removing containments from a surface which do not rely on the use of detergents, or mechanical scrubbing, abrasion, or grit blasting. Another advancement in the art would be more reliable methods and apparatus for cleaning and sterilizing surfaces in the field of medicine, such as operating room surfaces, surgical apparatus and clothing, and materials to be incorporated in surgical procedures.

Such methods and apparatus are disclosed and claimed herein.

BRIEF SUMMARY AND OBJECTS OF THE INVENTION

The present invention is related to an apparatus, and methods for its use, which is capable of cleaning a surface by using one or more excited gaseous species generated by the apparatus. In one preferred embodiment of the present invention, the apparatus is capable of producing a mixture of excited gases which in turn oxidize contaminants on the subject surface. The apparatus also includes means for removing the oxidized contaminants, waste gases, and related materials from the surface area.

In one preferred embodiment, the apparatus of the present invention provides a cleaning head which can be placed over the surface to be cleaned. The cleaning head is configured such that when it is placed over the surface, the cleaning head and the surface cooperate to form a generally enclosed chamber. The shape of the head may be varied depending on the particular application. One embodiment of the invention employs a generally dome-shaped cleaning head. Alternatively, an enclosed chamber may be provided such that the materials to be cleaned can be placed within the chamber.

Placed within the cleaning head, or at another location in immediate contact with the cleaning head, are one or more electrodes. In the typical configuration of the device, two electrodes are used. However, for certain surfaces, it is possible to use a single electrode which discharges directly to the surface being cleaned. As will be discussed below, electrical discharge across the electrodes produces the excited gaseous species used in the cleaning process. Accordingly, the electrodes are positioned within the device such that the excited gas can be effectively produced and directed toward the surface to be cleaned.

The electrodes are, in turn, placed in electrical contact with a source of electricity. The source of electricity will likely comprise a radio frequency power supply. The power supply is capable of producing a high voltage, high frequency discharge across the electrodes. The discharge across the electrodes, in turn, produces one or more excited gaseous species. These species may include plasma, nascent oxygen, and ozone. Other excited ions, atoms, and electrons may also exist in the resulting gaseous mixture.

As mentioned above, the excited gaseous mixture will exist in the chamber defined by the cleaning head and the surface or in the chamber container. This chamber can be thought of as a reaction chamber. Thus, the surface to be cleaned is exposed directly to these excited gases. It will be appreciated that the gases in their excited states are highly reactive and a powerful potential exists for oxidation of surface contaminants. In particular, any organic contaminants on the surface will be rapidly and completely oxidized by the excited gaseous species. The device may also be used in other surface treatment procedures, including preparing a surface for bonding or for coatings.

The device also includes means for introducing a selected gaseous mixture to the chamber. This means may include a tube which connects a source of pressurized gas with the interior of the reaction chamber. Therefore, the ultimate excited gas mixture can be controlled. For most applications, a flow of air will suffice. For other applications it may be desirable to employ pure oxygen, a particular oxygen mixture, or other selected gases. In any event, the present invention provides the capability of controlling the species of excited gas within the chamber.

The device is also provided with means for removing liquid, gaseous, and solid reaction products from the reaction chamber. The removal means may comprise an additional tube in communication with the interior of the chamber at one end and with a source of suction at the other end. Therefore, a flow of gas is established through the reaction chamber. It will be appreciated that most such reaction products will exist as gases. However, if such products happen to include liquids or solids, they can also be removed under the force of the suction.

Finally, in certain embodiments the device is provided with adequate means for manipulating the device across the subject surface. This may, for example, comprise a handle attached to the reaction chamber. The device may also be equipped with further safety features, including insulation of the reaction chamber such that touching the chamber during use will not cause injury. The device may also be insulated from discharging microwaves and other radiation. Finally, in one embodiment of the invention a collection vessel is provided for collecting reaction products and waste gases.

Accordingly, it is a primary object of the present invention to provide methods of cleaning a surface which avoid many of the problems encountered in the existing art.

More particularly, it is an object of the present invention to provide improved methods and apparatus for removing contaminants, including organic contaminants, from a surface.

It is a related object of the invention to provide methods and apparatus for removing contaminants from a surface, which methods do not rely on the use of organic solvents.

It is a further object of the present invention to provide methods and apparatus for removing contaminants from a surface which do not rely on the use of liquid or solid materials which are corrosive, toxic, or flammable.

It is another object of the present invention to clean, activate, or sterilize, a surface to enhance bonding, adhesion of coatings, adhesion of adjacent tissue and the like.

These and other objects and advantages of the invention will become apparent upon reading the following detailed description and appended claims, and upon reference to the accompanying drawings.

BRIEF DESCRIPTION OF THE DRAWINGS

In order to provide a more particular description of the invention briefly described above, reference will be made to specific embodiments thereof which are illustrated in the appended drawings. It will be appreciated that these drawings depict only typical embodiments of the invention and are not therefore to be considered limiting of its scope. The invention will be described and explained with additional specificity and detail through the use of the accompanying drawings in which.

DETAILED DESCRIPTION OF THE PREFERRED EMBODIMENTS

Figure 1:
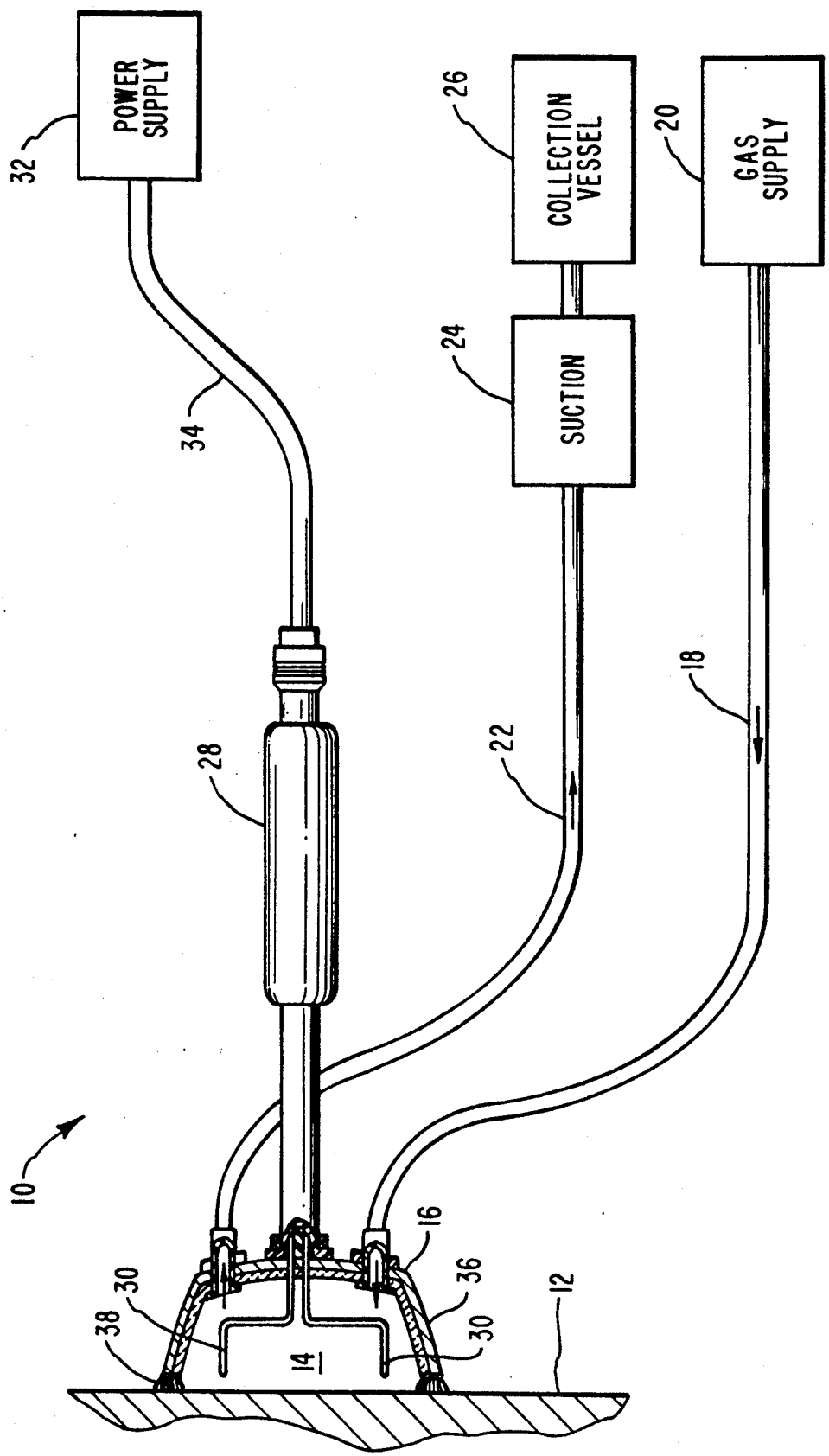
FIG. 1 is a side cross sectional view of one embodiment of the apparatus of the present invention.

The present invention can be best understood by reference to FIG. 1 where one embodiment of the device of the present invention is illustrated and designated 10. As mentioned above, the present invention provides methods and apparatus for removing contaminants from a surface. Contaminants are removed without the need for liquid organic solvents or other materials which are environmentally damaging, toxic, corrosive, or present difficulty in disposal.

As illustrated in FIG. 1, the device 10 includes a cleaning head 16 placed against a portion of surface 12. The cleaning head 16 may be constructed in a number of different shapes and sizes. However, the device 10, and cleaning head 16 in particular, is configured such that when the device 10 is placed against the surface 12, a generally enclosed reaction chamber 14 is formed. The head 16 can then be moved along the surface 12, thereby providing a moving reaction chamber. By moving the cleaning head 16 over the desired area the entire surface is cleaned, activated, or otherwise treated.

As mentioned above, selected gases can be introduced into the interior of the cleaning head 16 through a supply tube 18. In one preferred embodiment, the supply tube 18 is connected to a source of compressed gas 20. By introducing the compressed gas into the supply tube 18, a sustained flow of selected gases into the cleaning head 16 and reaction chamber 14 can be achieved. Thus, the reaction chamber 14 is provided with the desired gaseous species for activation and cleaning of the surface.

The device is also provided with an outlet tube 22. The outlet tube 22 may be placed in connection with a source of suction 24. By this mechanism, waste products and excess gases can be conveyed away from the reaction chamber 14 at least partially under the power of the suction source 24. The waste gases may then be passed through a collection vessel 26. The collection vessel 26 is preferably provided with means for cleaning the waste gas and removing any toxic, corrosive, or otherwise hazardous species before the remainder of the gas is discharged to the atmosphere.

A handle 28 is also illustrated in FIG. 1. It is preferred that the device be easily manipulated and maneuvered over the surface 12 in order to accomplish complete cleaning of the area of interest. One method of accomplishing this objective is by means of handle 28. Handle 28 is secured to the cleaning head 16 such that the device can be moved to the desired area of the surface 12.

FIG. 1 also illustrates a pair of electrodes 30. The electrodes may be any type of conventional electrode selected such that they function under the operating conditions of the device. The electrodes 30 are, in turn, connected to a power supply 32 by means of a cable 34. The power supply is preferably a radio frequency power supply and capable of producing a high frequency, high voltage discharge. Voltages produced by the power supply may vary widely. However, it is presently preferred that voltages in the 100,000 to 1,000,000 volt range be produced. However, voltages in the 50,000 volt range may also be acceptable under certain operating conditions. The power supply may consist of a number of commercially available power supplies.

The electrodes 30 are configured such that they produce an electrical discharge when powered by the power supply 32. The discharge takes place across the two electrodes 30. Alternatively, in some applications it is possible to use a single electrode and produce a discharge between the electrode and a conducting surface 12. In any event, an electrical discharge is created at a location sufficiently close to the reaction chamber to result in the placement of the desired excited gaseous species in the reaction chamber immediately adjacent to the surface 12.

As will be appreciated, the electrodes may be positioned at any location so long as the excited gases produced by discharge of the electrodes contacts the surface 12. In many applications, it will be desirable to position the electrodes 30 within the interior of the cleaning head 16, so that when the cleaning head 16 is placed adjacent to the surface 12, excited gases will immediately contact the surface.

The cleaning head 16 may be encircled by an electromagnetic shield 36. The shield is preferably constructed of a material having relatively high permeability and high electrical conductivity. Such materials may, for example, include copper foil. The shield 36 may be constructed of ceramic or an insulator in order to contain harmful emissions from the reaction chamber 14.

Furthermore, the base of the cleaning head may be provided with an electrically conductive brush 38. The brush 38 helps in defining a reaction chamber which remains generally enclosed as the device is moved across the surface 12. Thus, the device 10 is provided with all necessary features to safely and effectively enclose the reaction chamber 14 and to prevent harmful chemical and electro-magnetic emissions from the device 10.

When the device 10 is placed against the surface 12, the power supply 32 is activated. The electrical output of the power supply 32 in turn causes a high voltage, high frequency electrical discharge across the electrodes 30. The electrical discharge produces excited gaseous species within the reaction chamber 14, which may include plasma, nascent oxygen, ozone, and other excited atoms and ions.

Since the excited gases are extremely reactive, any contaminant on the surface 12 may be rapidly removed. In particular, organic oils and greases on the surface will be quickly and essentially completely oxidized. The primary reaction products of the oxidation reaction will be water vapor and carbon dioxide. However, traces of numerous other species may also exist in the typical case.

Because the reaction products in the reaction chamber 14 may include ozone, carbon monoxide, or other gaseous reaction products, it is preferable that these products be removed from the surface and collected. Therefore, the suction provided by suction source 24 through outlet tube 22 causes the reaction products and waste gases to flow out of the reaction chamber 14. In the event traces of liquids, aerosols, or solid are found in the reaction chamber 14, they can also be removed through outlet tube 22.

When the waste gases leave the reaction chamber 14, it may be desirable to clean the gases before releasing them to the atmosphere. Therefore, in one embodiment of the invention the outlet tube 22 is connected to a collection vessel 26. Collection vessel 26 contains the necessary filtering and collection apparatus to remove hazardous species from the outlet gas stream.

Figure 2:
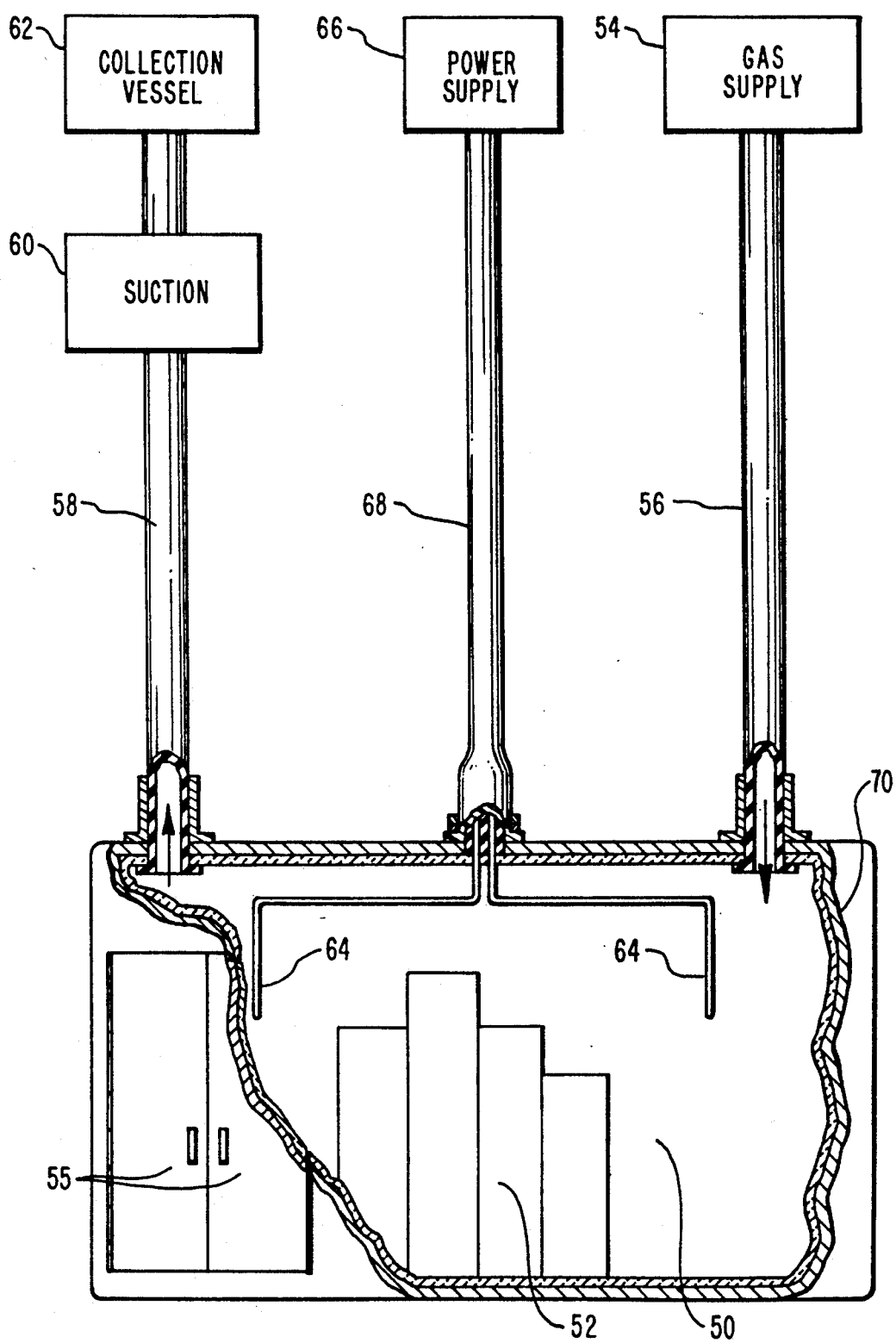
FIG. 2 is a side cross sectional view of an additional embodiment of the apparatus of the present invention.

It will be appreciated that in certain instances the objects of the present invention may be carried out by forming a totally enclosed chamber, and then placing the material to be treated within the enclosed chamber. Such an embodiment of the invention is illustrated in FIG. 2. FIG. 2 illustrates the device in an embodiment which includes such an enclosed chamber 50. The chamber 50 will include means for opening and closing the chamber 50 such that a piece of material 52 can be placed inside for treatment, and then easily removed. That means may include a door 54 or other similar mechanism.

The device illustrated in FIG. 2 includes some of the same elements as the device illustrated in FIG. 1. The device 50 is placed in communication with a gas supply 54 by way of a supply tube 56. Gases and other waste material would be removed from the chamber 50 by means of an outlet tube 58 under the force of a suction source 60. The device may also be provided with a collection vessel 62 which operates in the same manner as described above.

The interior of the chamber 50 will also contain various excited gaseous species for use in cleaning or surface treatment. Accordingly, a pair of electrodes 64 will be placed within the chamber 50, or at least sufficiently near the chamber to create excited gaseous species which can then be introduced into the chamber 50. The electrodes 64 are in turn placed in electrical communication with a power supply 66 by means of a cable 68 in order to provide the capability of creating a sufficient electrical discharge to produce the type of excited species which are of interest.

As with the embodiment of the device described with reference to FIG. 2, the device 50 may include various safety features. For example, a shield 70 may be provided for isolating the chamber 50 from its surroundings.

Using the present invention, it is also possible to vary the conditions within the reaction chamber of either embodiment. That is, the composition of the gaseous atmosphere may be adjusted by adjusting the gas supply feeding the chamber. The temperature within the chamber can also be easily adjusted, by variation in the operating characteristics of the electrodes, variation of the incoming gas temperature, or by other conventional means. Likewise, it may be desirable for some applications to carefully control the pressure within the reaction chamber of FIG. 2. Again, this is easily accomplished by conventional means using the structure of the devices described above. Thus, the reaction conditions within the device can be carefully controlled and adjusted to meet particular operating requirements.

It will also be appreciated that the present invention may include other means for exciting the gases within the chambers. For example, the electrodes may be replaced or accompanied by ultraviolet producing devices, high pressure arc, X-Ray emitting devices, sources of nuclear radiation, or other means for exciting gases. Thus, the present invention is extremely flexible and easily modified to perform under specific desired operating conditions.

As briefly mentioned above, while the present invention is specifically adaptable for use in cleaning surfaces, other surface treatment operations may also be accomplished by the present invention. For example, certain plastics must be "activated" prior to bonding. One example of such a material is teflon. The present invention provides means for activating such surfaces. Surfaces that can be treated using the present invention include metals, plastics, ceramics, and other materials. In addition, the present invention is not limited to oxidation of the subject surface, but rather is capable of causing other beneficial reactions as well.

Finally, while a gaseous environment has been described herein, it is also possible to use the present invention in other contexts. For example, in some applications it may be desirable to use a liquid or liquid/gaseous environment. In this type of operation, the activated gas could be bubbled into a liquid, and the liquid then applied to the surface to be treated.

The present invention as described, therefore, meets each of the identified objects of the invention. The present invention avoids many of the problems encountered in the existing art. In particular, the present invention provides improved methods and apparatus for removing contaminants from a surface, including organic contaminants, and provides methods for otherwise treating surfaces. The present invention avoids the use of organic solvents and other similar materials in the cleaning and treatment process. The present invention is capable of producing excited and reactive gaseous species directly adjacent to the surface to be cleaned or treated so that safe and effective cleaning is accomplished. Accordingly, the present invention provides a significant advancement in the art.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A device for cleaning a surface comprising:
   means for defining an enclosed chamber wherein at least a portion of the surface to be cleaned defines at least a portion of the interior surface of the chamber;
   means for activating a selected gas;
   means for introducing the activated gas into the chamber such that the portion of the surface which forms a portion of the chamber is capable of reacting with the activated gas;
   means for removing reaction products from the chamber; and
   a handle such that the device is capable of being manipulated over the surface by said handle.

2. A device for cleaning a surface as defined in claim 1 wherein said means for activating the gas comprises at least one electrode capable of activating the gas within the chamber.

3. A device for cleaning a surface as defined in claim 1 wherein said means for activating the gas within the chamber comprises two electrodes capable of activating the gas within the chamber.

4. A device for cleaning a surface as defined in claim 3 wherein the discharge of said electrodes is capable of producing an excited gaseous mixture within the chamber which includes ozone.

5. A device for cleaning a surface as defined in claim 4 wherein said means for activating the gas further comprises a power supply capable of producing a high voltage and high frequency discharge.

6. A device for cleaning a surface as defined in claim 1 wherein said means for introducing a gas into the chamber comprises a tube capable of carrying a gas.

7. A device for cleaning a surface as defined in claim 1 wherein said means for removing reaction products from the chamber comprises a tube capable of carrying said reaction products.

8. A device for cleaning a surface as defined in claim 7 wherein said means for removing reaction products further comprises a suction source in communication with said tube.

9. A device for cleaning a surface as defined in claim 2 wherein said means for activating the gas comprises means for causing a discharge between said at least one electrode and the surface to be cleaned.

10. A device for treating a surface, comprising:
    a head configured such that when the head is placed against a surface to be treated, the head and the surface together define an enclosed chamber;
    electrical means for exciting selected gases such that the excited gases are capable of reacting with selected materials on the surface;
    means for introducing said excited gases into the chamber;
    means for manipulating the chamber such that the device can be moved over a selected area of the surface to be treated; and
    means for transporting reaction products away from the chamber.

11. A device for treating a surface as defined in claim 10 wherein said means for manipulating the chamber comprises a handle attached to the device.

12. A device for treating a surface as defined in claim 10 wherein said means for exciting the gases within the chamber comprises a pair of electrodes capable of producing a sufficient electrical discharge to activate the gases within the chamber.

13. A device for treating a surface as defined in claim 10 wherein said means for exciting gases is capable of producing a mixture of ions, atoms, and electrons, which mixture includes ozone.

14. A device for treating a surface as defined in claim 12 wherein said means for exciting gases further comprises a power supply attached to the electrodes, which power supply is capable of producing a high frequency and high voltage discharge across said electrodes.

15. A device for treating a surface as defined in claim 14 wherein said high voltage discharge is in the range of from about 50,000 volts to approximately 1,000,000 volts.

16. A device for treating a surface as defined in claim 10 wherein said means for exciting gases within said chamber comprises an electrode and means for producing an electrical discharge between said electrode and said surface.

17. A method of cleaning a surface comprising the steps of:
   a. obtaining a device comprising
      a cleaning head configured such that when the cleaning head is placed against a surface to be cleaned, the cleaning head and the surface define an enclosed chamber;
      means for introducing a gas into the chamber;
      means for manipulating the chamber such that the device can be moved over a selected area of the surface to be cleaned;
      electrical means for exciting the gases within the chamber such that the excited gases are capable of oxidizing selected materials on the surface; and
      means for transporting reaction products away from the chamber;
   b. positioning the device adjacent to the surface to be clean such that a chamber is formed;
   c. introducing a gas into the chamber;
   d. activating said electrical means such that said gas is excited; and
   e. transporting reaction products from the chamber by said transporting means.

* * * * *